(12) United States Patent
Cornic et al.

(10) Patent No.: US 8,957,324 B2
(45) Date of Patent: Feb. 17, 2015

(54) INTERCONNECT FOR HIGH-FREQUENCY PRINTED CIRCUIT

(75) Inventors: Pascal Cornic, Brest (FR); Jean-Philippe Coupez, Le Reflecq Kerhuon (FR); Jérémie Hemery, Tourc'h (FR); Julien Boucher, Commana (FR)

(73) Assignees: Thales, Neuilly sur Seine (FR); Groupe des Telecommunications/Ecole Nationale Superieure des Telecoms Bretagne, Brest (FR)

( * ) Notice: Subject to any disclaimer, the term of this patent is extended or adjusted under 35 U.S.C. 154(b) by 375 days.

(21) Appl. No.: 12/879,915

(22) Filed: Sep. 10, 2010

(65) Prior Publication Data

US 2011/0215882 A1 Sep. 8, 2011

(30) Foreign Application Priority Data

Sep. 11, 2009 (FR) .................................... 09 04348

(51) Int. Cl.
*H05K 1/11* (2006.01)
*H01P 3/08* (2006.01)
*H05K 1/02* (2006.01)
*H05K 3/42* (2006.01)

(52) U.S. Cl.
CPC ................ *H05K 1/115* (2013.01); *H01P 3/081* (2013.01); *H05K 1/0251* (2013.01); *H05K 1/116* (2013.01); *H05K 3/429* (2013.01); *H05K 2201/09627* (2013.01); *H05K 2201/09718* (2013.01); *H05K 2201/0979* (2013.01)
USPC .......................................... 174/262; 333/246

(58) Field of Classification Search
CPC ....... H01P 3/081; H01P 5/028; H01P 3/0882; H05K 1/115
USPC .................................................... 333/33, 246
See application file for complete search history.

(56) References Cited

U.S. PATENT DOCUMENTS 6,023,211 A * 2/2000 Somei ........................... 333/246
6,933,450 B2 * 8/2005 Okumichi et al. ............. 174/264
(Continued)

FOREIGN PATENT DOCUMENTS

WO 2008/105478 A1 9/2008

OTHER PUBLICATIONS

Scott A. Wartenberg, et al., "A Coaxial-to-Microstrip Transition for Multilayer Substrates", IEEE Transactions on Microwave Theory and Techniques, Feb. 2004, pp. 584-588, vol. 52, No. 2, XP11107716.

*Primary Examiner* — Benny Lee
*Assistant Examiner* — Rakesh Patel
(74) *Attorney, Agent, or Firm* — Baker Hostetler LLP

(57) ABSTRACT

The invention relates to a printed circuit for high-frequency signals, and more particularly to interconnect means between transmission lines situated on different faces of the printed circuit. According to the invention, in the vicinity of the interconnect means, the transmission lines each extend in a main direction. The interconnect means comprise two vias each extending along an axis. In a plane containing the main direction of a first of the transmission lines and perpendicular to the face bearing the first transmission line, an orthogonal fix is formed whose abscissa is borne by the main direction of the first transmission line. The abscissae of the axes of the vias or of their projection on the plane, perpendicularly to the plane, are separate.

8 Claims, 6 Drawing Sheets

(56) References Cited

U.S. PATENT DOCUMENTS

| | | |
|---|---|---|
| 7,336,502 B1 | 2/2008 | Goergen |
| 2005/0202722 A1 | 9/2005 | Regnier et al. |
| 2008/0191362 A1 | 8/2008 | Chuang et al. |
| 2009/0015345 A1* | 1/2009 | Kushta et al. ................... 333/34 |
| 2009/0033442 A1 | 2/2009 | Zhao et al. |
| 2009/0107716 A1 | 4/2009 | Pai et al. |
| 2009/0315158 A1 | 12/2009 | Maetani |

* cited by examiner

INTERCONNECT FOR HIGH-FREQUENCY PRINTED CIRCUIT

CROSS-REFERENCE TO RELATED APPLICATION

This application claims priority to foreign French patent application No. FR 09 04348, filed on Sep. 11, 2009, the disclosure of which is incorporated by reference in its entirety.

FIELD OF THE INVENTION

The invention relates to a printed circuit for high-frequency signals, and more particularly to interconnect means between transmission lines situated on different faces of the printed circuit. The invention is of particular use for the transmission of radio frequency signals in the X band, in particular for frequencies of 9 to 10 GHz. The invention can be adapted to other frequency bands.

BACKGROUND

In order to convey high-frequency signals, a so-called microstrip technology implemented on a printed circuit is, for example, used. Printed conductive tracks are produced on faces of the printed circuit. These faces may be external or internal and may be separated by one or more conductive planes. The microstrip lines have particular dimensions so that, once associated with the conductive planes, they form impedance-matched lines. This matching makes it possible to ensure a certain transparency of the line with regard to the signal conveyed. In other words, the aim is to minimize the electrical power losses of the signal along the line.

The transmission line may have to change from one face to another of the printed circuit. For this, vias, also known as metallized holes, are used that ensure electrical contact between the tracks of different faces. The vias are generally of circular section. The simplest way of producing these vias is drilling of the printed circuit followed by metallization of the interior of the hole.

FIG. 1 illustrates this embodiment in a printed circuit 10 comprising two external faces 11 and 12 each bearing a microstrip line, respectively 13 and 14. The two lines 13 and 14 are interconnected by means of a via 15. FIG. 2 represents an enlarged view of the printed circuit 10 around the via 15 and FIG. 3 represents the printed circuit 10 in cross section around the via 15. The printed circuit also comprises two conductive planes 16 and 17. Around the via 15, the two conductive planes 16 and 17 are interrupted to form, in each, a resist, respectively 18 and 19, through which the via 15 passes.

A simple radio frequency interconnect via in a multilayer structure, as illustrated in FIGS. 1 to 3, exhibit spurious electrical effects, which in particular break the transparency of the via with regard to the signal conveyed. This transparency is above all degraded at high frequency. These effects, notably linked to the intrinsic inductive nature of the via 15, then result in a mismatching and greater or lesser insertion losses on the signal.

FIG. 4 represents the matching level S11 of the example represented in FIGS. 1 to 3 expressed in dB according to the frequency of the signal conveyed by the interconnect. The matching level illustrates the electrical power reflected by the interconnect. Still for this example, FIG. 5 represents the insertion level S21 or insertion loss expressed in dB according to the frequency of the signal. The insertion level illustrates the electrical power loss in transmission at the interconnect.

It is, in this case, found that the via 15 exhibits a matching level of −14.5 dB for the useful working frequency of 9.3 GHz, and insertion losses of 0.49 dB for this same frequency. Given these results, the interconnect is far from optimal.

SUMMARY OF THE INVENTION

The invention improves the transparency of a via-type interconnect in a printed circuit between two transmission lines positioned on different faces of the circuit. The invention seeks to increase the matching level and to reduce the transmission losses.

To this end, the invention is a printed circuit for high-frequency signals, comprising at least two faces each bearing at least one transmission line for the signals and means for interconnecting the transmission lines between the two faces, a transmission line of one face being linked to a transmission line of another face by means of two vias each extending along an axis, wherein, in the vicinity of the interconnect means, the transmission lines each extend in a main direction, wherein in a plane containing the main direction of a first of the transmission lines and perpendicular to the face bearing the first transmission line, an orthogonal fix is formed whose abscissa is borne by the main direction of the first transmission line, and wherein the abscissae of the axes of the vias or of their projection on the plane, perpendicularly to the plane, are separate.

BRIEF DESCRIPTION OF THE DRAWINGS

The invention will be better understood and other advantages will become apparent from reading the detailed description of an embodiment given by way of example, the description being illustrated by the appended drawing in which:

In the interest of clarity, the same elements are given the same identifiers in the various figures. FIGS. 1 to 5 have already been described to introduce the invention.

DETAILED DESCRIPTION

Figure 6:
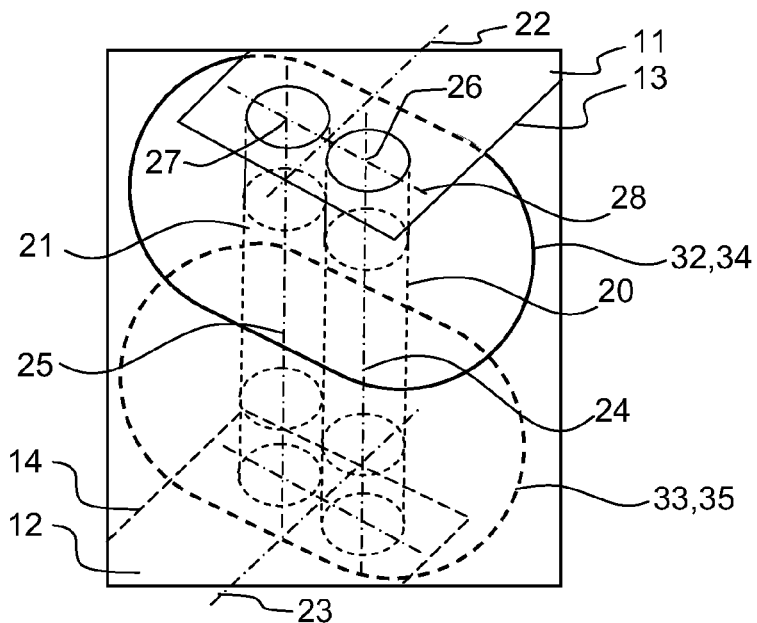
FIG. 6 represents a first embodiment of the invention.

FIG. 6 represents an enlarged view of the printed circuit 10 around the interconnect which, this time, comprises two vias 20 and 21 linking the two transmission lines 13 and 14, each of which extends in a main direction, respectively 22 and 23. The main directions each belong to the plane in which the external faces 11 and 12 of the printed circuit extend. The two vias 20 and are tubular-section metallized holes each extending along an axis, respectively 24 and 25. The vias are, for example, produced by drilling the printed circuit followed by metallization. The vias 20 and 21 then have a circular section perpendicularly to their respective axes 24 and 25. Other machining methods may replace the drilling, such as, for example, laser cutting. A straight line 28 perpendicular to the main direction 22 passes through the two intersections 26 and 27 of the axes 24 and 25 with the plane of the face 11. In this embodiment, the main directions 22 and 23 are parallel.

Figure 7:
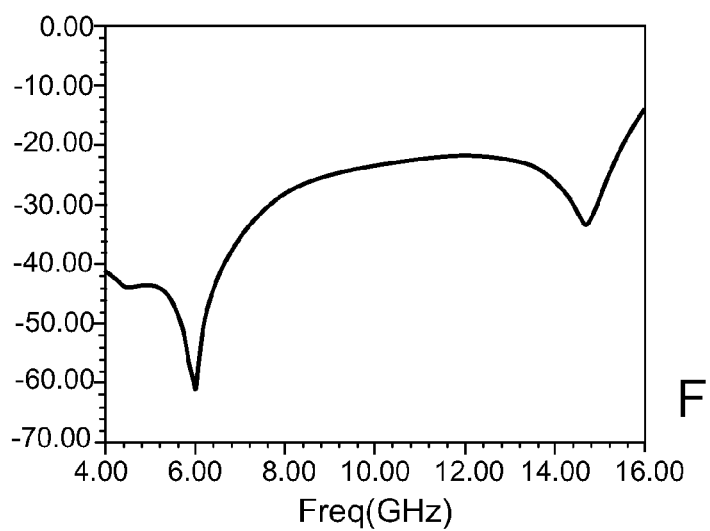
FIGS. 7 and 8 present numerical data illustrating the transparency of the interconnect represented in FIG. 6.
Figure 8:
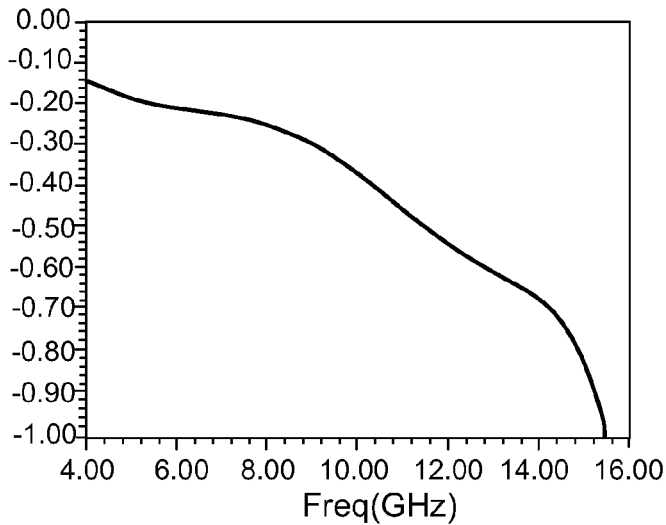

This interconnect structure with two vias, called structure with two parallel vias, is used to improve the transparency of the interconnect. It has already been seen that a via has mainly an inductive nature leading to losses in the interconnect. In a first approach, the two parallel vias can be modelled by two parallel inductances, which provides better transparency for the interconnect due to a lower interconnect inductance than for a single via. In reality, couplings between vias exist and the results of an electromagnetic simulation are presented in FIGS. 7 and 8. FIG. 7 represents the matching level S11 of this structure and FIG. 8 represents the insertion level S21. At a frequency of 9.3 GHz, the matching level is −24.5 dB and the insertion losses are 0.31 dB.

The insertion and matching levels are better than those measured with a single via. The aim is, however, to further improve the transparency of the interconnect.

Figure 9:
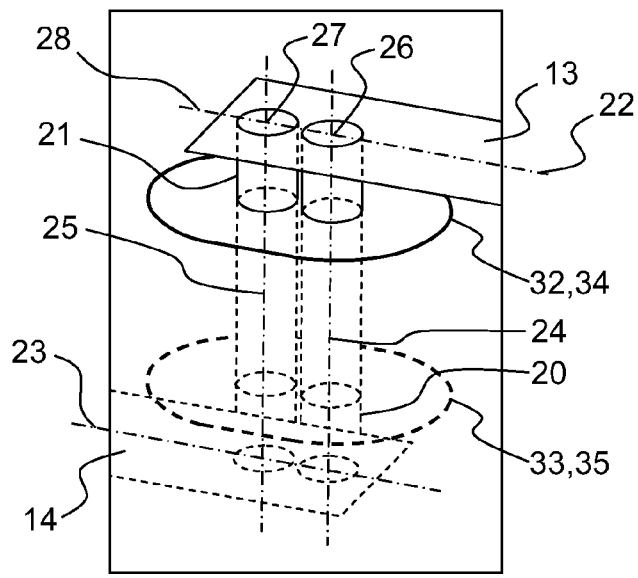
FIG. 9 represents a second embodiment of the invention.

FIG. 9 represents a second embodiment allowing for this improvement and constituting the best embodiment of the invention. In this embodiment, the vias are no longer parallel as in FIG. 6. In FIG. 9, the vias are cascaded. In other words, the straight line 28 passing through the two intersections 26 and 27 of the axes 24 and 25 with the plane of the face 11 is no longer perpendicular to the main direction 22. In the example represented in FIG. 9, the straight line 28 is merged with the main direction 22. Obviously, it is possible to vary the angle of the straight line 28 and of the main direction 22. An improvement in the transparency of the interconnect is already observed as soon as the straight line 28 is moved away from a direction perpendicular to the main direction 22.

In other words, in a plane 30 containing the main direction 22 and perpendicular to the face 11, an orthogonal fix is formed whose abscissa is borne by the main direction 22. In this fix, the abscissae of the axes 24 and 25 of the vias 20 and 21 or of their projection on the plane 30 perpendicularly to the plane 30 are separate.

The improvement in transparency is of particular interest when the main directions 22 and 23 of the two transmission lines 13 and 14 are parallel. This cascaded via structure also offers an advantage when there is a limitation imposed by the width of the transmission lines. In practice, this width is an important parameter in defining the characteristic impedance of the transmission line. Placing two vias in cascade configuration makes it possible not to widen the transmission line in order to place the two vias 20 and 21 therein.

The invention is not limited to two cascaded vias. It is also possible to produce the interconnect for the two transmission lines 13 and 14 by means of more than two vias which, when cascaded, do not exceed a volume defined by the overlapping of the two transmission lines 13 and 14 when the axes 22 and 23 are parallel.

To improve the transparency of an interconnect, the dimensional parameters of the interconnect are important. These parameters must be adapted according to the frequency band of the electrical signal. The cascaded via structure allows for a wide choice of dimensional parameters and within a greater range of variation than for parallel vias.

Figure 10A:
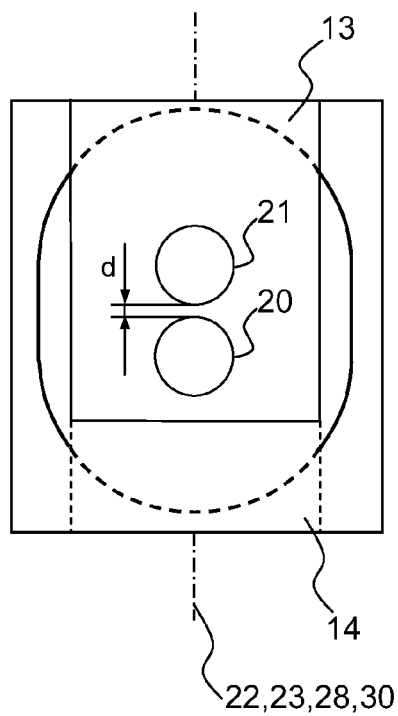
FIGS. 10a and 10b represent a distance variation between two vias producing the interconnect of FIG. 9.
Figure 10B:
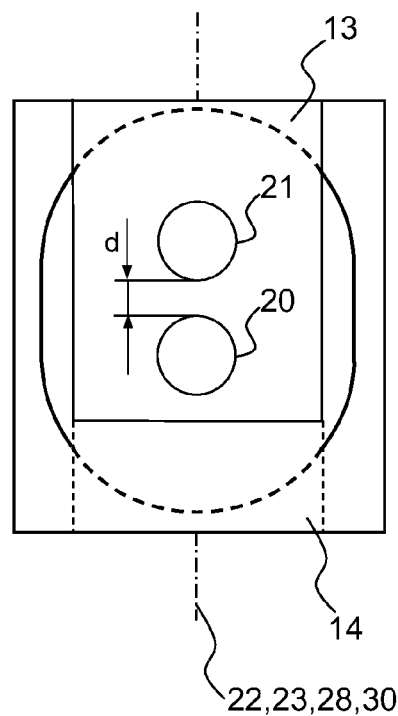

The distance between two vias form a first possible adjustment parameter. FIGS. 10a and 10b represent a variation in a distance d between the two vias 20 and 21 producing the interconnect of FIG. 9. These two figures are represented in a plane perpendicular to the plane 30 whose plot appears in these figures superimposed on the main directions 22 and 23 and on the straight line 28. In FIG. 10a, the distance d is less than that represented in FIG. 10b.

In a numerical example with figures, at the frequency of 9.3 GHz, the microstrip lines have an impedance of 50Ω for a width of 1.91 mm and for a substrate with a thickness of 0.813 mm and a relative permittivity equal to 3.38. The two vias 20 and 21 have a diameter of 600 μm.

Figure 11:
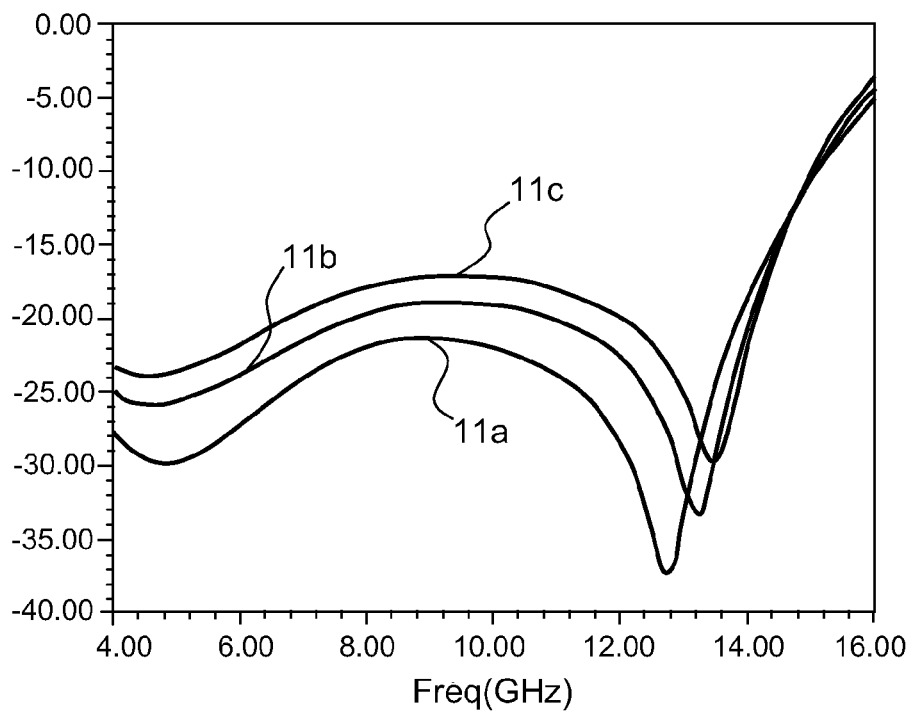
FIGS. 11 and 12 present numerical data illustrating the transparency of the interconnect represented in FIGS. 9, 10a and 10b.

FIG. 11 represents, for this example with figures, the matching level S11 of the interconnect represented in FIG. 9 with the distance d varied. More specifically, FIG. 11 is the result of a simulation for which a curve 11a represents the trend of the matching level S11 for a distance d of 100 μm separating two vias 20 and 21 each with a diameter of 600 μm. A curve 11b represents the trend of the matching level S11 for a distance d of 200 μm separating the same two vias and a curve 11c for a distance d of 300 μm.

Figure 12:
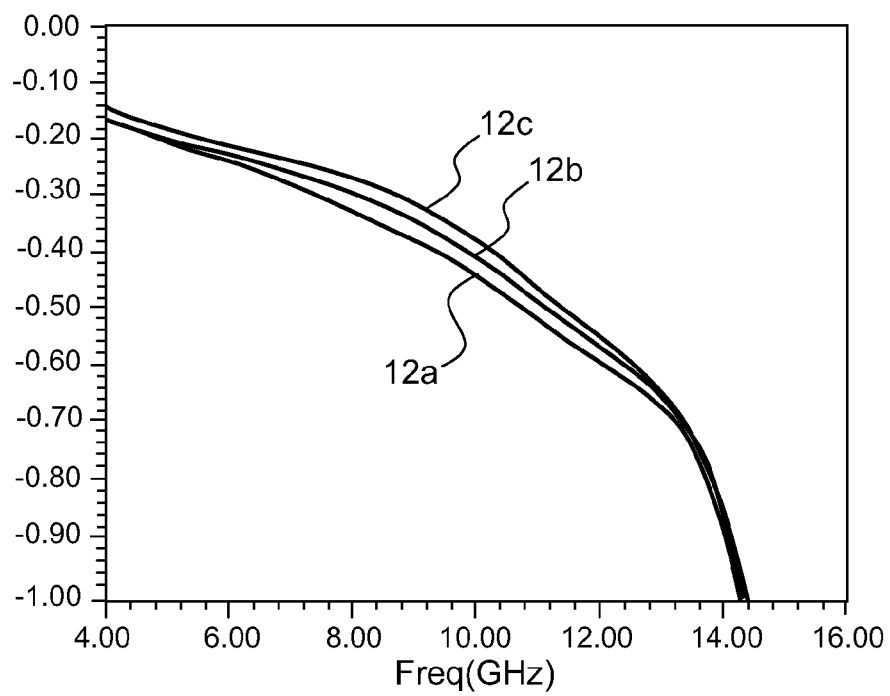

FIG. 12 represents, still for the same example with figures, the insertion level S21 with three curves: 12a for the distance d of 300 μm; 12b for the distance d of 200 μm; 12c for the distance d of 100 μm.

For example, for a frequency of 9.3 GHz and a distance d of 100 μm, the matching level is −21.4 dB and the insertion losses are 0.33 dB. For this same frequency and the distance d of 200 μm, the matching level is 18.9 dB and the insertion losses are 0.36 dB. Finally, still at 9.3 GHz, for the distance d of 300 μm, the matching level is −17 dB and the insertion losses are 0.39 dB.

Figure 13:
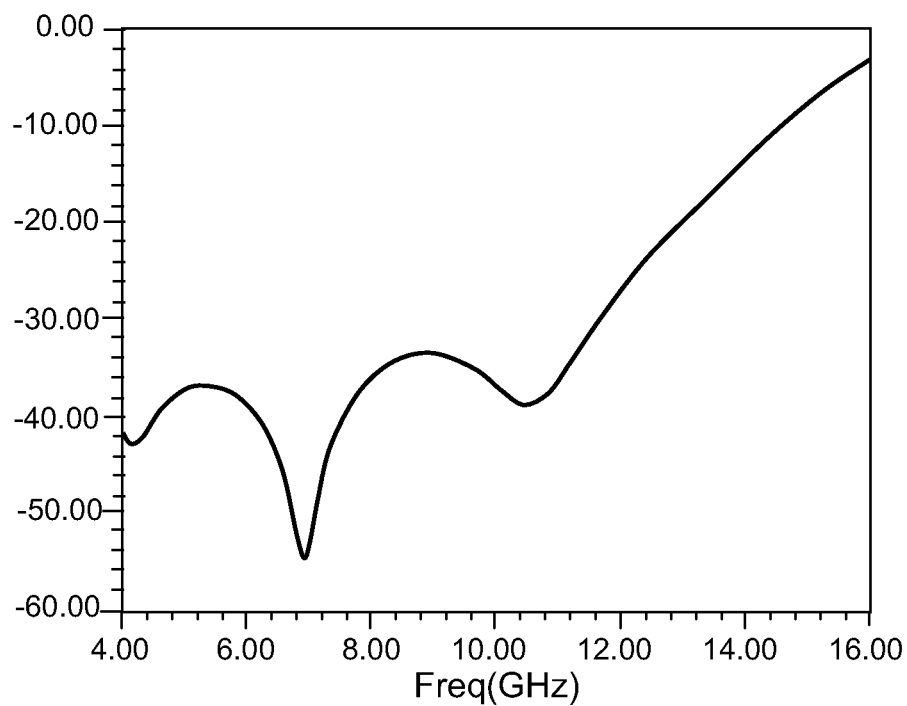
FIGS. 13 and 14 present numerical data illustrating the transparency of the interconnect for the via diameter variation.
Figure 14:
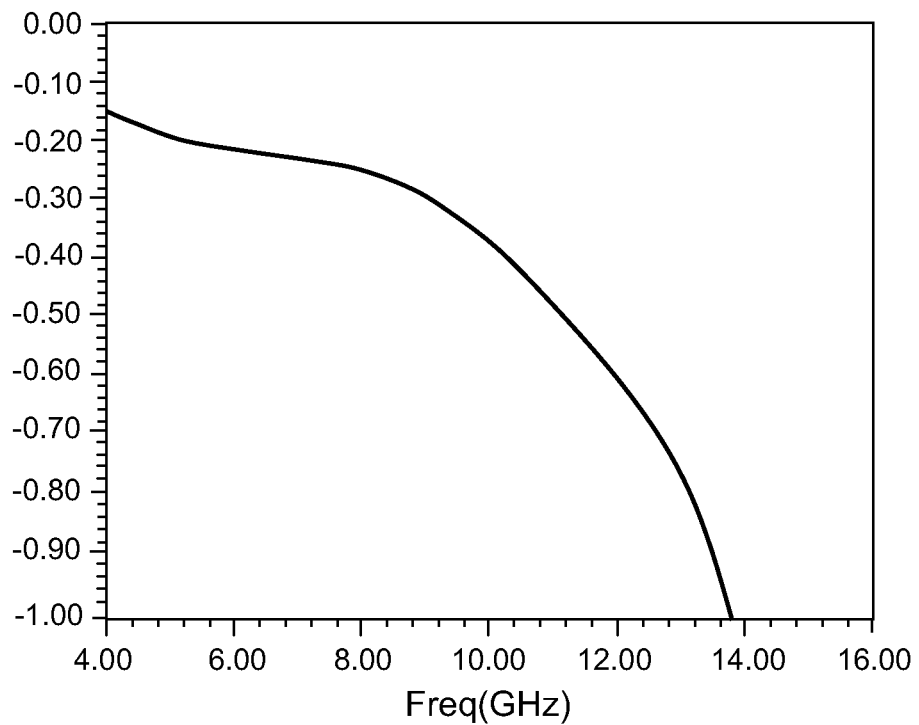

Another dimensional parameter that can be adjusted to improve the transparency of the interconnect is the diameter of the cascaded vias 20 and 21. FIG. 13 represents a simulation of the matching level S11 and FIG. 14 represents a simulation of the insertion level 21 for the interconnect represented in FIG. 9, in which the diameter of the vias 20 and 21 is 500 μm for a distance d separating the vias 20 and 21 of 200 μm. For the frequency of 9.3 GHz, the matching level is −34 dB and the insertion losses are 0.31 dB. It is found that the results are even better than for the parallel vias for which numerous simulations have been done without obtaining such good results.

Figure 1:
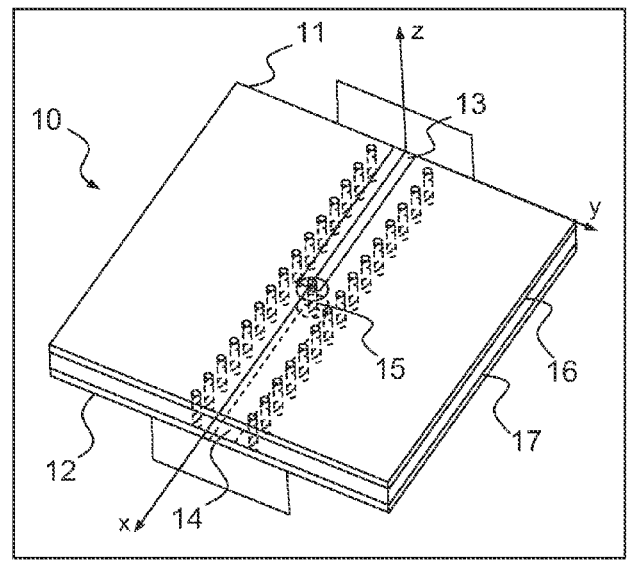
FIGS. 1 to 3 represent a known printed circuit in which a via is used to interconnect two transmission lines positioned on different faces of the circuit.
Figure 2:
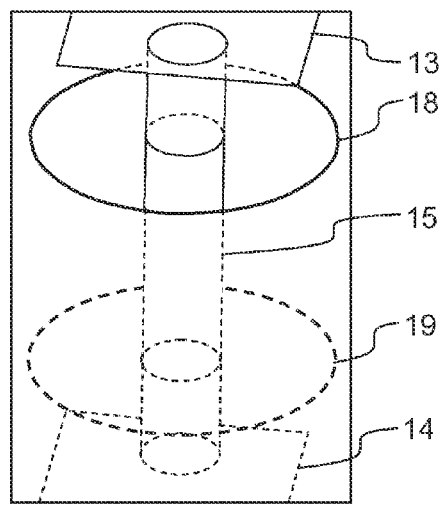
Figure 3:
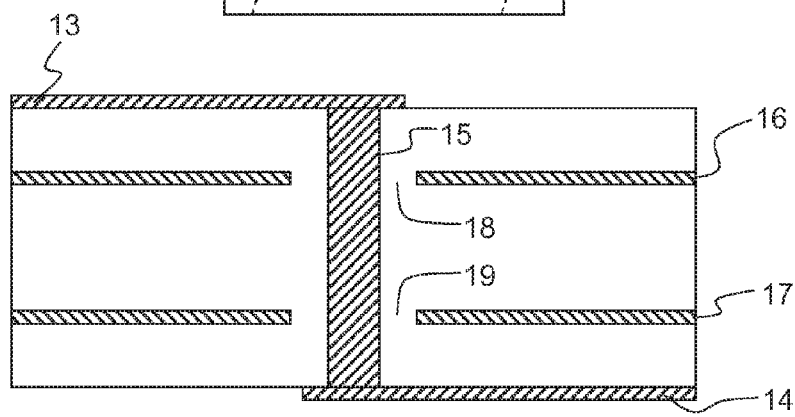
Figure 4:
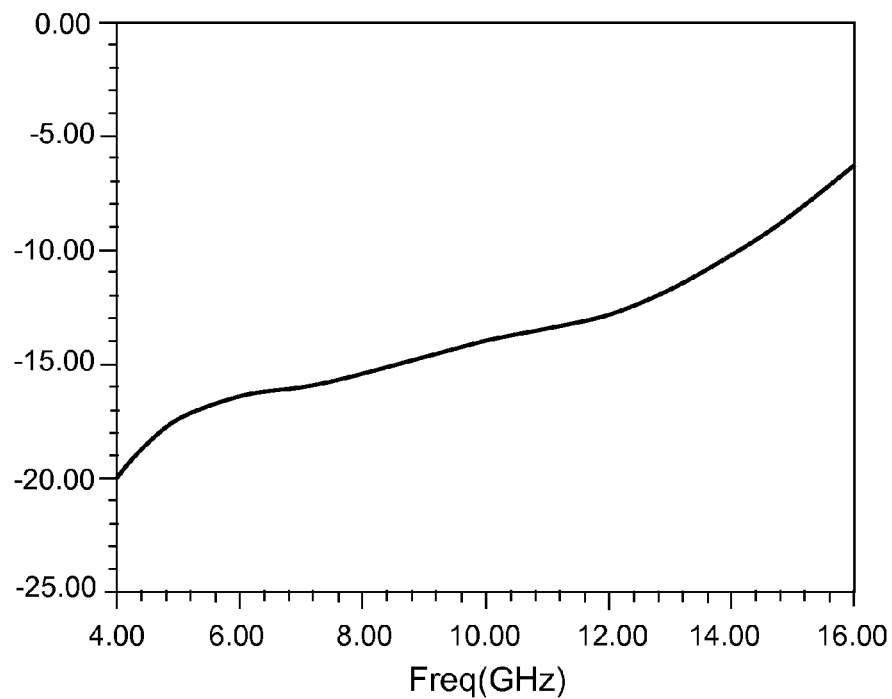
FIGS. 4 and 5 present numerical data illustrating the transparency of the interconnect represented in FIGS. 1 to 3.
Figure 5:
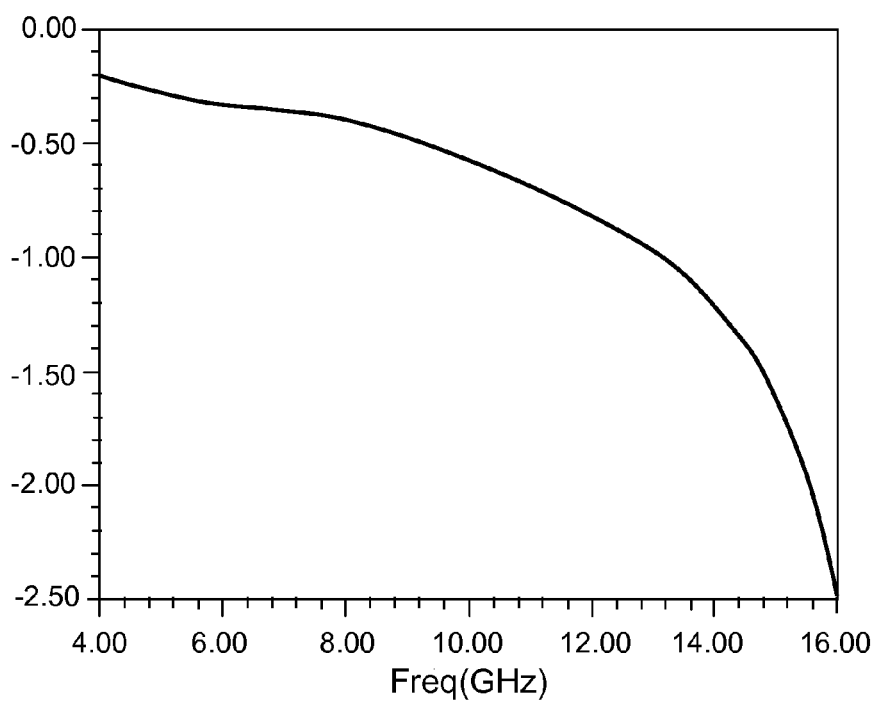

Advantageously, the printed circuit comprises at least one conductive plane positioned between the two faces 11 and 12. In the examples represented in FIGS. 6 and 9, the printed circuit comprises two conductive planes 32 and 33 similar to the planes 16 and 17 of FIG. 1. Around the vias 20 and 21, the two conductive planes 32 and 33 are interrupted to form, in each, a resist, respectively 34 and 35, through which the vias 20 and 21 pass. The resists 34 and 35 each have an oblong shape, the rounded ends of which are centred on intersections of the axes 24 and 25 of the vias 20 and 21 with the respective conductive planes 32 and 33.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A printed circuit for high-frequency signals comprising:
   a first face;
   a second face;
   a first transmission line located on the first face for transmitting the high-frequency signals;
   a second transmission line on the second face for transmitting the high-frequency signals;
   a first via extending along a first axis and linking the first transmission line to the second transmission line; and
   a second via extending along a second axis and linking the first transmission line to the second transmission line, wherein the first transmission line extends continuously along the first face between the first via and the second via in a first main direction intersecting the first axis and the second axis, and the second transmission line extends continuously along the second face between the first via and the second via in a second main direction intersecting the first axis and the second axis.

2. The printed circuit according to claim 1, wherein the first main direction and the second main direction are in parallel.

3. The printed circuit according to claim 2, having at least one conductive plane positioned between the first face and the second face, the at least one conductive plane containing an interruption through which the first and second vias pass, the interruption having an oblong shape with rounded ends that are centered on respective intersections of the axes of the first and second vias with the at least one conductive plane.

4. The printed circuit according to claim 3, wherein the first and second vias have a circular section perpendicular to respective axes thereof axes.

5. The printed circuit according to claim 2, wherein the first and second vias have a circular section perpendicular to respective axes thereof axes.

6. The printed circuit according to claim 1, having at least one conductive plane positioned between the first face and the second face, the at least one conductive plane containing an interruption through which the first and second vias pass, the interruption having an oblong shape with rounded ends that are centered on respective intersections of the axes of the first and second vias with the at least one conductive plane.

7. The printed circuit according to claim 6, wherein the first and second vias have a circular section perpendicular to respective axes thereof axes.

8. The printed circuit according to claim 1, wherein the first and second vias have a circular section perpendicular to respective axes thereof axes.

* * * * *